United States Patent
Tsaur et al.

(10) Patent No.: US 10,192,817 B2
(45) Date of Patent: Jan. 29, 2019

(54) ELECTROSTATIC DISCHARGE PROTECTION ELEMENT

(71) Applicant: Realtek Semiconductor Corp., Hsinchu (TW)

(72) Inventors: Tay-Her Tsaur, Tai-Nan (TW); Cheng-Cheng Yen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 335 days.

(21) Appl. No.: 15/065,523

(22) Filed: Mar. 9, 2016

(65) Prior Publication Data

US 2017/0077086 A1 Mar. 16, 2017

(30) Foreign Application Priority Data

Sep. 14, 2015 (TW) .............................. 104130276 A (51) Int. Cl.
  *H01L 27/02* (2006.01)
  *H01L 23/50* (2006.01)
  *H01L 23/60* (2006.01)

(52) U.S. Cl.
  CPC .............. *H01L 23/50* (2013.01); *H01L 23/60* (2013.01); *H01L 27/0288* (2013.01)

(58) Field of Classification Search
  CPC ...... H01L 23/50; H01L 23/60; H01L 27/0288
  See application file for complete search history.

(56) References Cited

U.S. PATENT DOCUMENTS

| 5,567,982 A | 10/1996 | Bartelink |
| 6,342,722 B1 | 1/2002 | Armacost et al. |
| 2004/0027779 A1* | 2/2004 | Byrne ........................ H05F 3/04 361/220 |
| 2005/0063118 A1* | 3/2005 | Durth ........................ H01T 2/02 361/91.1 |
| 2007/0041141 A1* | 2/2007 | Deng ........................ H01B 3/10 361/118 |
| 2007/0216015 A1* | 9/2007 | Schnitt ..................... H01L 21/84 257/692 |
| 2012/0243133 A1 | 9/2012 | Wu |

FOREIGN PATENT DOCUMENTS

| TW | 201218564 A | 5/2012 |
| TW | 201218564 A1 | 5/2012 |
| TW | 201240066 A | 10/2012 |
| TW | 201240066 A1 | 10/2012 |
| TW | 201314861 A1 | 4/2013 |
| TW | 201334640 A | 8/2013 |
| TW | 201334640 A1 | 8/2013 |
| WO | WO 2013/070806 A1 | 5/2013 |

* cited by examiner

*Primary Examiner* — Zeev V Kitov (74) *Attorney, Agent, or Firm* — Muncy, Geissler, Olds & Lowe, P.C.

(57) ABSTRACT

An electrostatic discharge protection element is provided, which leads out the electrostatic discharge current between an internal circuit and an input/output terminal in the event of electrostatic discharge. The electrostatic discharge protection element includes an I/O pad, conductor, and a gap structure. The I/O pad is connected between the I/O terminal and the internal circuit, and the conductor is connected to a ground terminal. The gap structure is disposed between the I/O pad and the conductor, which is configured to establish a path from the I/O pad to the conductor connected to the ground terminal for conducting the electrostatic discharge current.

10 Claims, 10 Drawing Sheets

ELECTROSTATIC DISCHARGE PROTECTION ELEMENT

CROSS-REFERENCE TO RELATED APPLICATION

This application claims the benefit of Taiwan Patent Application No. 104130276, filed on Sep. 14, 2015, in the Taiwan Intellectual Property Office, the disclosure of which is incorporated herein in its entirety by reference.

BACKGROUND OF THE INVENTION

1. Field of the Invention

The present disclosure relates in general to an electrostatic discharge (ESD) protection element, and more particularly to an electrostatic discharge protection element which leads out an electrostatic discharge current between an internal circuit and an input/output terminal in the event of electrostatic discharge.

2. Description of the Related Art

As far as the integrated circuit is concerned, the electrostatic discharge protection circuit is disposed between the internal circuit and I/O pins to prevent burst of charges entering the I/O pin from damaging the internal circuit of the integrated circuit. Consequently, when excessive transient voltage or current is generated, the electrostatic discharge protection circuit can instantaneously guide the excessive transient voltage or current to the voltage source so as to prevent the damage of core circuit.

As mentioned above, for the sake of reducing the impact of the electrostatic discharge on the internal circuit, an extra space designed to place the electrostatic discharge protection circuit becomes indispensable. However, it may change the original space allocation and component design of the IC, and the manufacturing process may be changed accordingly, causing the increase of time and cost.

As a consequence, an electrostatic discharge protection element designed to effectively reduce the cost and promote the spatial usage is necessary.

SUMMARY OF THE INVENTION

In view of the aforementioned technical problems, the primary objective of the present disclosure provides an electrostatic discharge protection element which leads out an electrostatic discharge current between an internal circuit and an input/output terminal in the event of electrostatic discharge. The electrostatic discharge protection element may include an input/output (I/O) pad, a conductor, and a gap structure. The I/O pad may be connected between the I/O terminal and the internal circuit, and the conductor may be connected to a ground terminal. The gap structure may be disposed between the I/O pad and the conductor, which is configured to establish a path from the I/O pad to the conductor connected to the ground terminal for conducting the electrostatic discharge current.

Preferably, the gap structure may include at least one air layer, at least one dielectric layer or at least one porous material.

Preferably, the shape of the I/O pad may include a circle, a rectangle, and a polygon.

Preferably, the gap structure may surround the I/O pad.

Preferably, another conductor may be further disposed between the I/O pad and the gap structure and configured to establish the path joining the I/O pad, the other conductor, the gap structure, and the conductor connected to the ground terminal for conducting the electrostatic discharge current.

The other objective of the present disclosure provides an electrostatic discharge (ESD) protection element which leads out an electrostatic discharge current between a first internal circuit and a second internal circuit in the event of electrostatic discharge. The electrostatic discharge protection element may include an I/O pad, a plurality of first conductors, and a plurality of gap structures. The I/O pad may be connected between the first internal circuit and the second internal circuit. A plurality of first conductors may be connected to a plurality of ground terminals respectively. A plurality of gap structures may each be respectively disposed between the I/O pad and each first conductor and configured to establish each path from the I/O pad to each first conductor connected to each ground terminal for conducting the electrostatic discharge current.

Preferably, the plurality gap structures may include at least one air layer, at least one dielectric layer or at least one porous material.

Preferably, the plurality of gap structures may surround the I/O pad.

Preferably, the plurality of first conductors may be interconnected.

Preferably, a second conductor may be further disposed between the I/O pad and each gap structure and configured to establish a plurality of paths joining the I/O pad, each second conductor, each gap structure and each first conductor connected to each ground terminal for conducting electrostatic discharge current.

As mentioned previously, in the event of electrostatic discharge, the gap structures of an electrostatic discharge protection element of the present disclosure are capable of directing the electrostatic discharge current to ground terminals by providing conducting paths thereto, which in turn protect electronic components connected to the I/O pad. In addition, the I/O pad is feasible to be the layout cell for chip integration. When the transient energy activates the path from the internal circuit to the ground terminal to conduct electrostatic discharge current, the orientation of the I/O pad layout cell is adjustable along with the gap structure to provide a conducting path for energy dissipation for the test such as ESD Test, system-level ESD test (E-gun test), EFT test, and surge test. Moreover, the I/O pad of the electrostatic discharge protection element of the present disclosure is applicable to the whole chip in the form of unit cell for fast integration into the system chip.

BRIEF DESCRIPTION OF THE DRAWINGS

Hereinafter, embodiments of the present invention will be described in detail with reference to the accompanying drawings so that those skilled in the art to which the present invention pertains can realize the present invention, in which.

DETAILED DESCRIPTION OF THE PREFERRED EMBODIMENTS

Hereinafter, embodiments of the present disclosure will be described in detail with reference to the accompanying drawings so that those skilled in the art to which the present disclosure pertains can realize the present disclosure. As those skilled in the art would realize, the described embodiments may be modified in various different ways, all without departing from the spirit or scope of the present disclosure.

For better understanding, like elements are designated by like reference numerals in the accompanying drawings and the following description for the embodiments.

Figure 1:
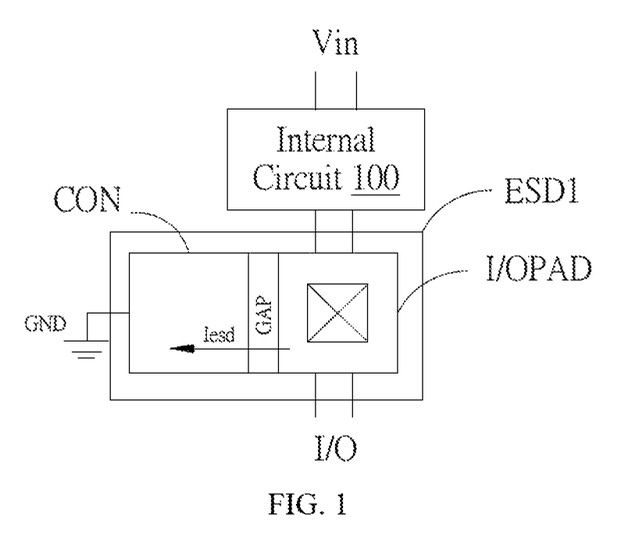
FIG. 1 is a schematic diagram of the first embodiment of an electrostatic discharge protection element of the present disclosure.

Please refer to FIG. 1, which is a schematic diagram of the first embodiment of an electrostatic discharge (ESD) protection element of the present disclosure. As shown in the figure, the ESD protection element is applied to lead out an electrostatic discharge current between an internal circuit 100 and an input/output (I/O) terminal in the event of electrostatic discharge. The electrostatic discharge protection element ESD1 includes an input/output pad I/OPAD, a conductor CON and a gap structure GAP. The I/O pad I/OPAD is connected between the input/output terminal I/O and the internal circuit 100. The conductor CON is connected to a ground terminal GND. The gap structure GAP is disposed between the I/O pad I/OPAD and the conductor CON and configured to establish a path (the arrowhead shown in the figure) from the I/O pad I/OPAD to the conductor CON connected to the ground terminal GND for conducting the electrostatic discharge current Iesd.

Specifically, the ESD protection element ESD1 of the present disclosure is applicable to the test such as ESD Test, system-level ESD test (E-gun test), EFT test, and surge test, and compatible with the limitation of lattice orientation or manufacturing process of the semiconductor chip. The I/O pad I/OPAD is feasible to be the layout cell for chip integration. In the event of electrostatic discharge, the transient energy activates a path from the internal circuit 100 to the ground terminal GND to conduct electrostatic discharge current. The orientation of the I/O pad I/OPAD layout cell is adjustable along with the gap structure GAP to provide a conducting path for energy dissipation for test such as ESD Test, system-level ESD test (E-gun test), EFT test, and surge test. As shown in FIG. 1, the I/O pad I/OPAD of the electrostatic discharge protection element of the present disclosure is applicable to the whole chip in the form of unit cell for fast integrating into the system chip.

Figure 2:
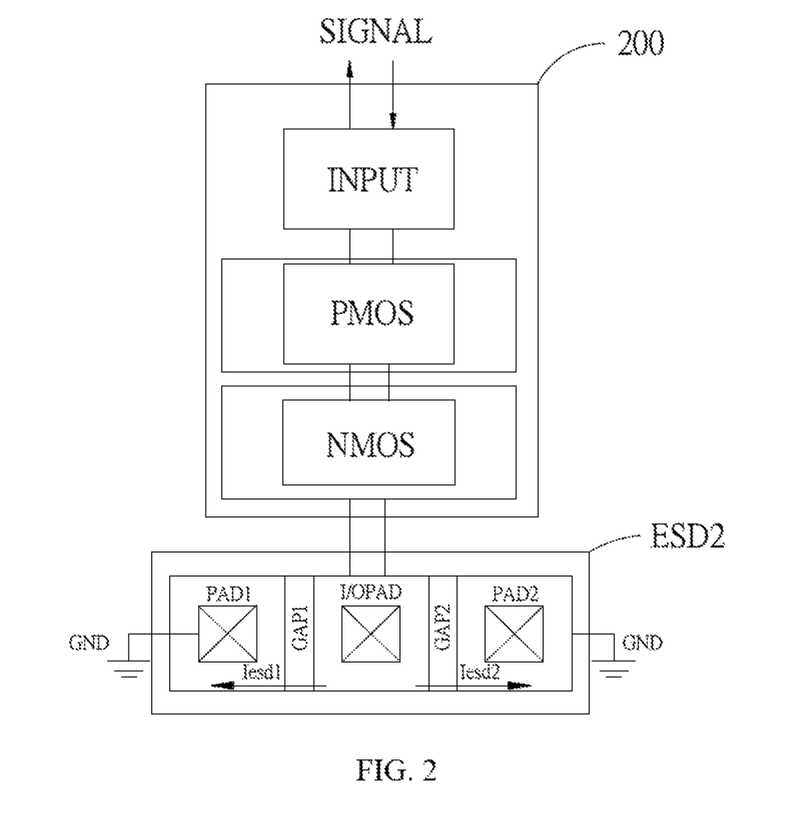
FIG. 2 is a schematic diagram of the second embodiment of an electrostatic discharge protection element of the present disclosure.

Please refer to FIG. 2, which is a schematic diagram of the second embodiment of an electrostatic discharge protection element of the present disclosure. As shown in the figure, in the event of electrostatic discharge, the electrostatic discharge protection element ESD2 is applied to lead out the electrostatic discharge current between the internal circuit 200 and the I/O pad I/OPAD served as the I/O terminal. The electrostatic discharge protection element ESD2 includes the input/output pad I/OPAD, the first pad PAD1, the second pad PAD2 and the gap structures GAP1 and GAP2. The input/output pad I/OPAD is connected to the internal circuit 200 and serves as the I/O terminal of the internal circuit 200. In the present embodiment, the internal circuit 200 is connected to the signal source SIGNAL with an input circuit INPUT, P-type metal oxide semiconductor (PMOS) and N-type metal oxide semiconductor (NMOS) for the sole purpose of illustration. The arrangement of the internal circuit 200 shall be not limited thereto. For example, the internal circuit 200 may be a single chip, a timing controller or a driving circuit.

The first pad PAD1 and the second pad PAD2 are respectively connected to the ground terminal GND. The gap structures GAP1, GAP2 are respectively disposed in the spaces between the I/O pad I/OPAD and the first pad PAD1 and between the I/O pad I/OPAD the second pad PAD2. During electrostatic discharge, both paths which are from the I/O pad I/OPAD to first pad PAD1 connected to ground terminal GND and from I/O pad I/OPAD to second pad PAD2 connected to ground terminal GND, respectively conduct the electrostatic discharge currents Iesd1 and Iesd2 (the arrowheads shown in the figure).

In the present embodiment, the electrostatic discharge protection element ESD2 is disposed with two gap structures GAP1 and GAP2 which correspond to the first pad PAD1 and the second pad PAD2, respectively. With the setting of present embodiment, the electrostatic discharge current Iesd1 and the electrostatic discharge current Iesd2 are provided with a plurality of conducting paths, so that the electrostatic discharge currents Iesd1 and Iesd2 are guided to the ground terminal GND in the event of electrostatic discharge. In addition, when excessive transient voltage or current is generated, the electrostatic discharge protection element ESD2 instantaneously guides the transient voltage or current to the ground terminal GND so as to prevent the internal circuit 200 from being damaged.

Preferably, the gap structures GAP1 and GAP2 may be an air layer, a dielectric layer or a porous material. The gap structure configured in a way that, in the event of electrostatic discharge, the gap structure will conduct electrostatic discharge current if the excessive transient voltage is greater than the breakdown voltage of the gap structure. As the result, most of the abnormal current flow to the ground terminal. For example, the dielectric layer, which may be zinc oxide (often served as the component material of Transient Voltage Suppressors (TVS)), is applied as the gap structure material to dissipate the transient energy so as to protect the electronic component.

Figure 3A:
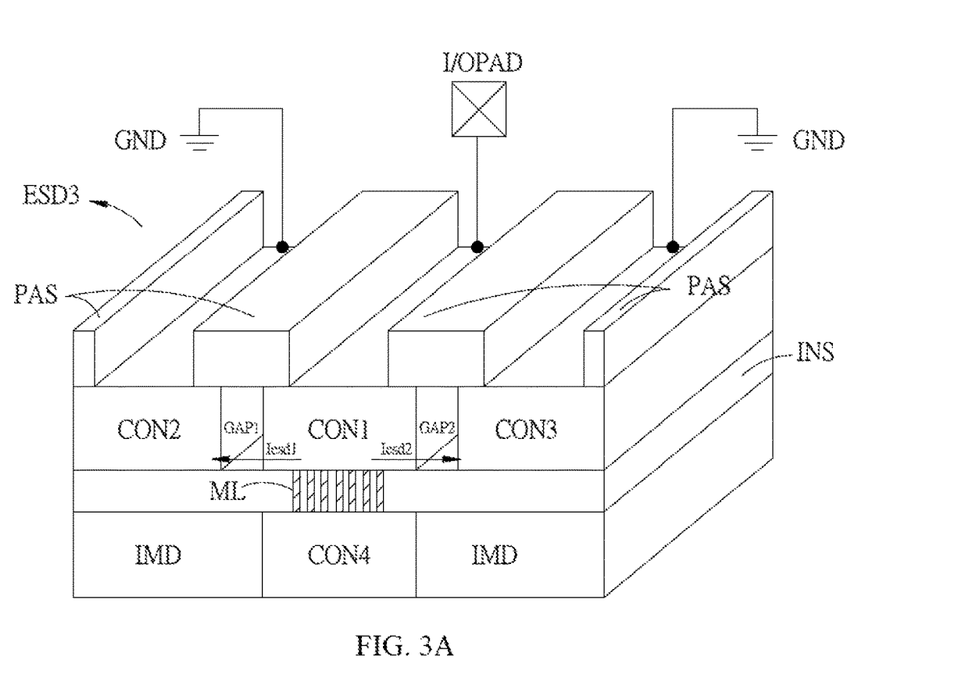
FIG. 3A is a perspective view of the third embodiment of an electrostatic discharge protection element of the present disclosure.

Please refer to FIG. 3A, which is a perspective view of the third embodiment of an electrostatic discharge protection element of the present disclosure. As shown in the figure, the electrostatic discharge protection element ESD3 includes the input/output pad I/OPAD, a passive layer PAS, conductors CON1, CON2, CON3 and CON4, the gap structures GAP1 and GAP2, a plurality of metal lines ML, an insulating layer INS, and a plurality of inter-metal dielectric layers IMD. The passive layer PAS is an insulating layer structure on the surface of semiconductor and designed to avoid oxidation or corrosion of the conductors CON1, CON2, and CON3 thereunder. The I/O pad I/OPAD is connected to the conductor CON1, and both sides of the conductor CON1 are disposed with the gap structures GAP1 and GAP2. The conductor CON4, which is disposed between the inter-metal dielectric layers IMD, is connected to the conductor CON1 through the plurality of metal lines ML in the insulating layer INS, such that the external circuit is electrically connected to the I/O pad I/OPAD through the conductors CON1, CON4 and the plurality of metal lines ML.

In addition, the conductors CON2 and CON3 are respectively disposed adjacent to the gap structures GAP1 and GAP2, and respectively connected to the ground terminal GND. This setting provides conducting paths so that, in the event of electrostatic discharge, the electrostatic discharge currents Iesd1 and Iesd2 are guided respectively to the ground terminal GND so as to prevent the impact of the electrostatic discharge on the electronic component connected to the I/O pad.

Figure 3B:
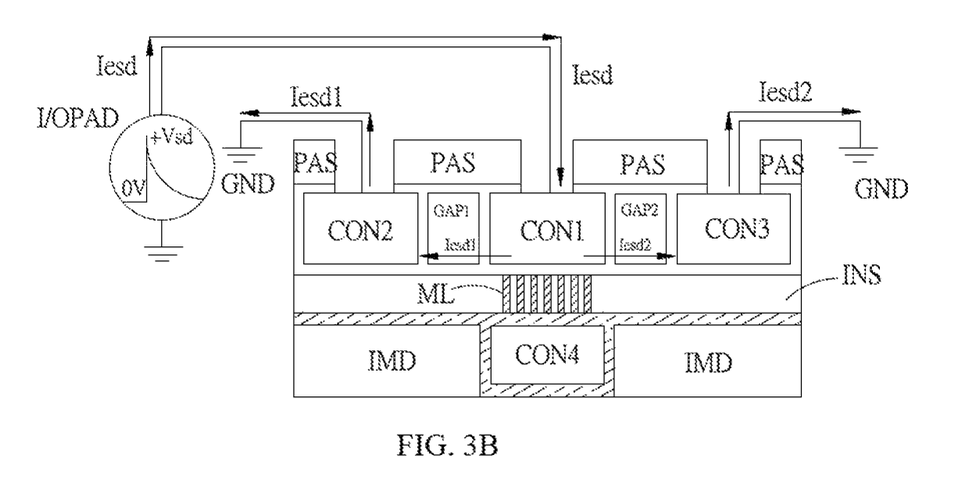
FIG. 3B is a sectional view of the third embodiment an electrostatic discharge protection element of the present disclosure while an event of electrostatic discharge occurs.

Please refer to FIG. 3B, which is a sectional view of the third embodiment an electrostatic discharge protection element of the present disclosure during electrostatic discharge. As shown in the figure, while an event of electrostatic discharge occurs, an electrostatic transient voltage Vsd (positive voltage as in the present embodiment) is generated. The electrostatic discharge current Iesd as represented by the arrowhead flows to the conductor CON1 and generates a transient voltage at the gap structures GAP1 and GAP2 which is greater than the breakdown voltages thereof. In the present embodiment, the gap structures GAP1 and GAP2 are configured to divide the electrostatic discharge current Iesd into two ESD currents Iesd1 and Iesd2 which flow respectively to the ground terminal GND, preventing the impact of electrostatic transient voltage Vsd on the internal electronic component.

Figure 4:
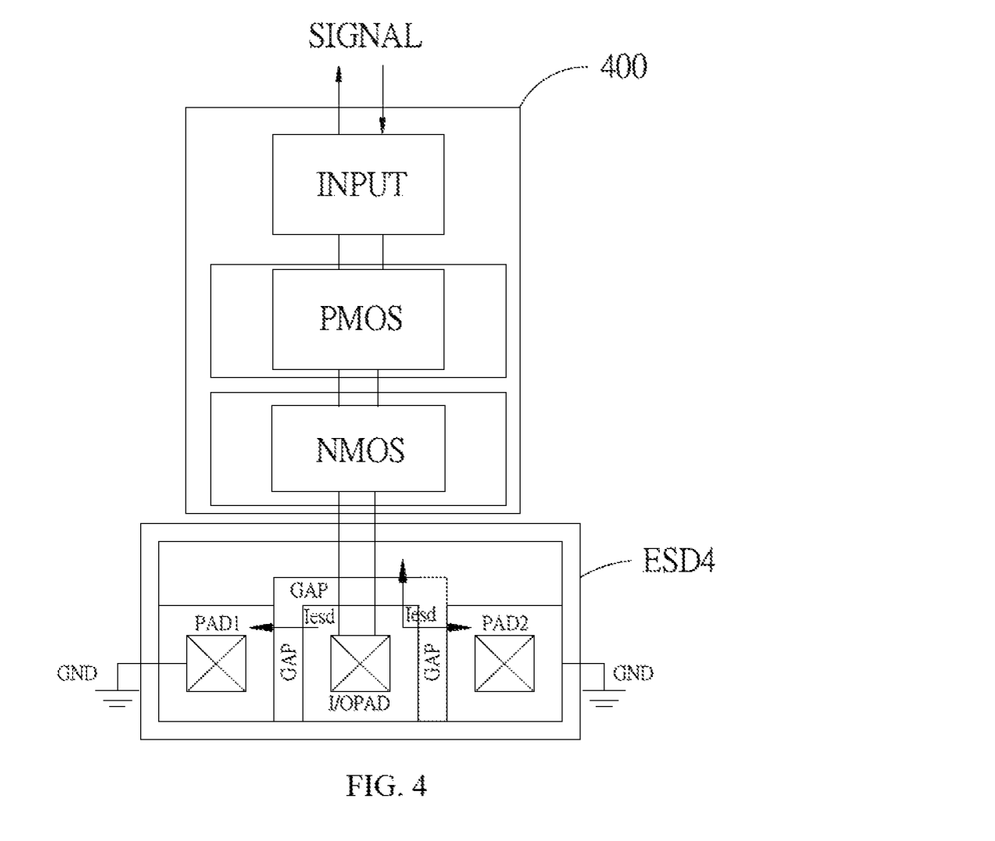
FIG. 4 is a schematic diagram of the fourth embodiment of an electrostatic discharge protection element of the present disclosure.

Please refer to FIG. 4, which is a schematic diagram of the fourth embodiment of an electrostatic discharge protection element of the present disclosure. The present embodiment is similar to the second embodiment, so the unnecessary details are no longer given herein. As shown in the figure, while an event of electrostatic discharge occurs, the electrostatic discharge protection element ESD4 is applied to lead out the electrostatic discharge current between the internal circuit 400 and the I/O pad I/OPAD served as the I/O terminal. The electrostatic discharge protection element ESD4 includes the I/OPAD, the first pad PAD1, the second pad PAD2, the conductor CON and the gap structure GAP. The I/O pad I/OPAD is connected to the internal circuit 400 and serves as the I/O terminal of the internal circuit 400. The first pad PAD1 and the second pad PAD2 are respectively connected to the ground terminal GND. The gap structure GAP is disposed in the spaces between the I/O pad I/OPAD and the first pad PAD1 and between the I/O pad I/OPAD and the second pad PAD2, surrounding the I/O pad I/OPAD. In addition, the first pad PAD1 and the second pad PAD2 are connected to each other through the conductor CON. Substantially as the result of this, the conductor CON is also electrically connected to the ground terminal GND. In the event of electrostatic discharge, a path joining the I/O pad I/OPAD, the conductor, the grounded first pad PAD1 and the grounded second pad PAD2, serves as a conducting path for the electrostatic discharge current Iesd, which directs the electrostatic discharge current Iesd to the ground terminal GND. So, when excessive transient voltage or current is generated, the electrostatic discharge protection element ESD4 instantaneously guides the transient voltage or current to the ground terminal GND through different conducting paths so as to prevent the internal circuit 400 from being damaged.

Figure 5:
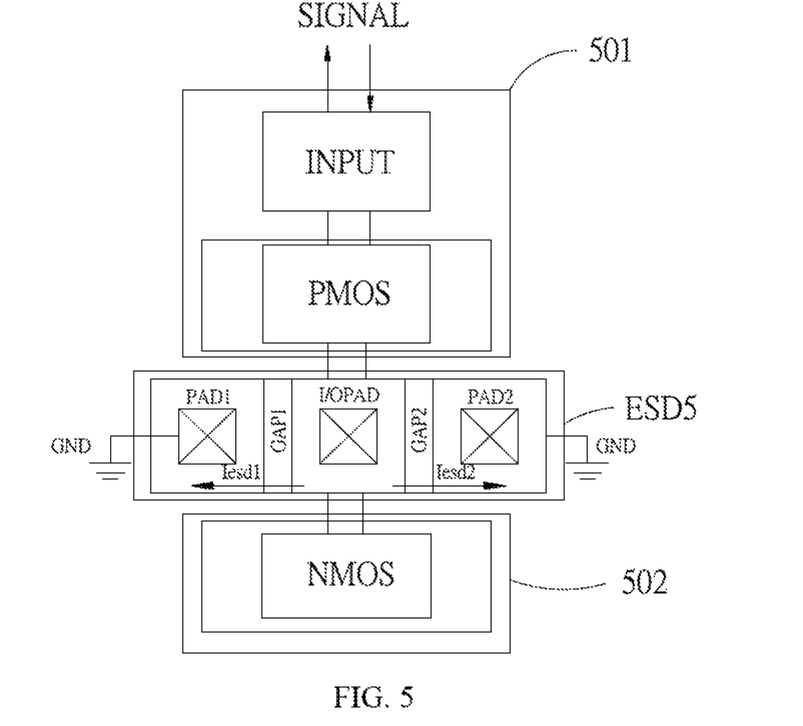
FIG. 5 is a schematic diagram of the fifth embodiment of an electrostatic discharge protection element of the present disclosure.

Please refer to FIG. 5, which is a schematic diagram of the fifth embodiment of an electrostatic discharge protection element of the present disclosure. As shown in the figure, in the event of electrostatic discharge, the electrostatic discharge protection element ESDS is applied to lead out the electrostatic discharge current of the I/OPAD between the first internal circuit 501 and the second internal circuit 502. The electrostatic discharge protection element ESDS includes the I/O pad I/OPAD, the first pad PAD1, the second pad PAD2 and the gap structures GAP1 and GAP2. The I/O pad I/OPAD serves as the I/O terminal connecting the first internal circuit 501 and the second internal circuit 502. In the present embodiment, the first internal circuit 501 is connected to the signal source SIGNAL which includes an input circuit INPUT and P-type metal oxide semiconductor PMOS while the second internal circuit 502 includes N-type metal oxide semiconductor NMOS. The setting thereof only serves as illustration, the arrangements of the first internal circuit 501 and the second internal circuit 502 shall be not limited thereto.

It is similar to the second embodiment that the first pad PAD1 and the second pad PAD2 are respectively connected to the ground terminal GND. The gap structures GAP1 and GAP2 are respectively disposed in the spaces between the I/O pad I/OPAD and the first pad PAD1 and between the I/O pad I/OPAD and the second pad PAD2. In the event of electrostatic discharge, both paths which are from the I/O pad I/OPAD to the first and second pad PAD1 and PAD2 connected to the ground terminal GND conduct the electrostatic discharge currents Iesd1 and Iesd2 (both represented by the arrowheads shown in the figure) respectively. In addition, the configurations of gap structures GAP1 and GAP2 in the present embodiment respectively correspond to the PAD1 and PAD2. Consequently, in the event of electrostatic discharge, a plurality of conducting paths are provided for directing the electrostatic discharge currents Iesd1 and Iesd2 to the ground terminal GND. Moreover, when excessive transient voltage or current is generated, the electrostatic discharge protection element ESDS instantaneously guides it to the ground terminal GND so as to prevent the first internal circuit 501 or the second internal circuit 502 from being damaged by the excessive transient voltage or current no matter the excessive transient voltage or current is generated in the first internal circuit 501 or the second internal circuit 502.

Figure 6:
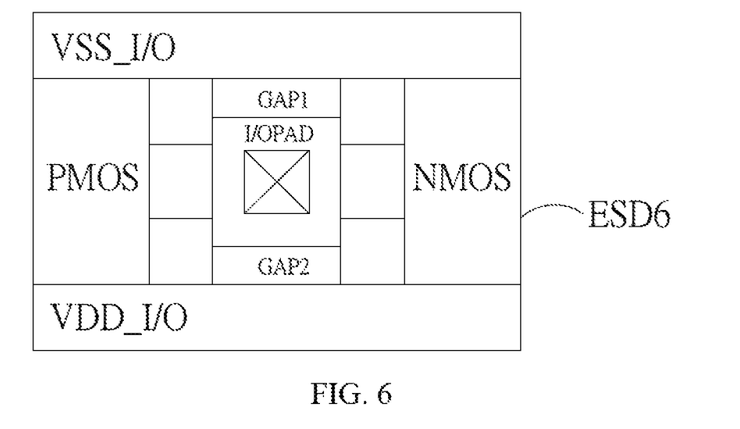
FIG. 6 is a schematic diagram of the sixth embodiment of an electrostatic discharge protection element of the present disclosure.

Please refer to FIG. 6 which is a schematic diagram of the sixth embodiment of an electrostatic discharge protection element of the present disclosure. It is similar to the former embodiment that P-type metal oxide semiconductor (PMOS) is connected to N-type metal oxide semiconductor (NMOS) through the I/O pad I/OPAD. The difference between the present embodiment and the former one lies that the gap structures GAP1 and GAP2 are directly disposed between the I/O pad I/OPAD and the voltage sources VSS_I/O and VDD_I/O of P-type metal oxide semiconductor PMOS and N-type metal oxide semiconductor NMOS. In the event of electrostatic discharge, the electrostatic discharge current directly flows to the voltage sources VSS_I/O and VDD_I/O through the gap structures GAP 1 and GAP2 which act as the conducting paths mentioned in the former embodiment.

Figure 7A:
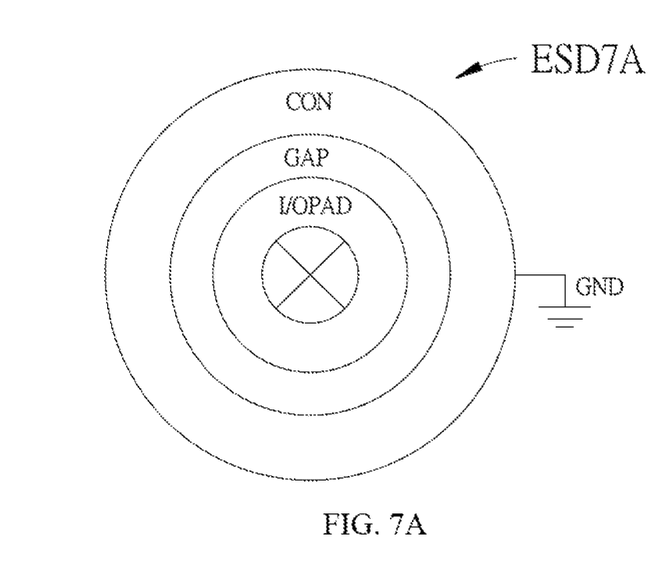
FIGS. 7A to 7C are the schematic diagrams of different exemplary aspects of an electrostatic discharge protection element of the present disclosure.
Figure 7B:
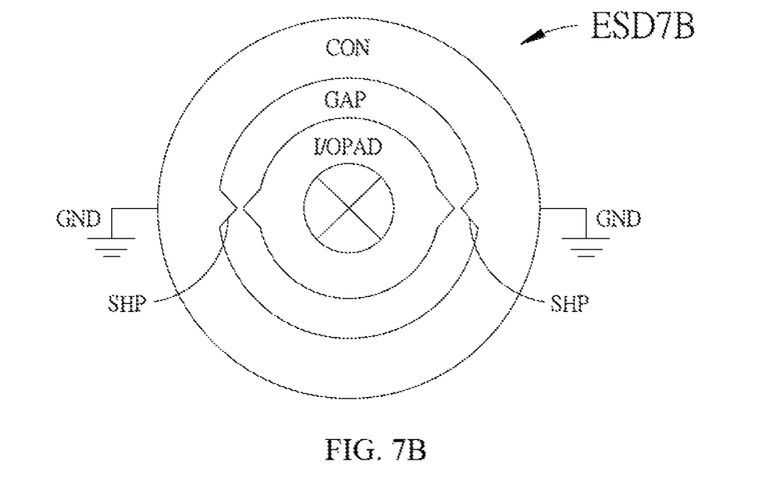
Figure 7C:
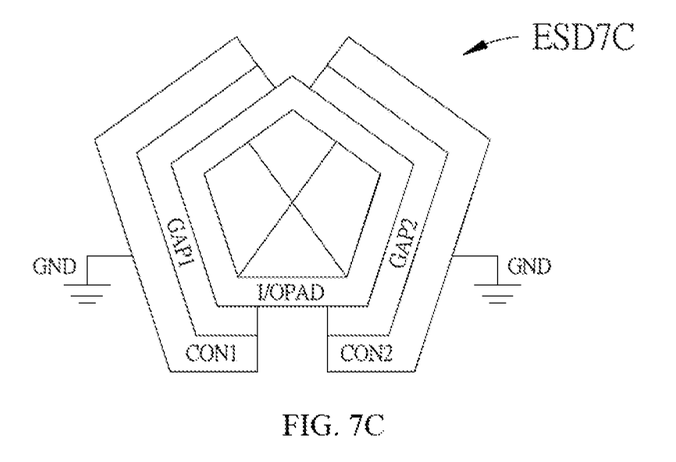

Please refer to FIGS. 7A through 7C, which are the schematic diagrams of different exemplary aspects of an electrostatic discharge protection element of the present disclosure. As shown in FIG. 7A, the electrostatic discharge protection element ESD7A includes the conductor CON, the gap structure GAP and the I/O pad I/OPAD. In the present embodiment, the I/O pad I/OPAD may be a circular structure, the gap structure GAP may surround the I/O pad I/OPAD in a shape corresponding to that of the I/O pad I/OPAD, and the conductor CON is connected the ground terminal GND and disposed outside the gap structure GAP.

The electrostatic discharge protection element ESD7A is feasible to replace the electrostatic discharge protection elements ESD1 through ESD6 mentioned previously. In the event of electrostatic discharge, the electrostatic discharge protection element ESD7A is configured to provide a plurality of conducting paths to the electrostatic discharge current, such that the electrostatic discharge flows to the ground terminal GND without affecting the electronic components electrically connected to the I/O pad.

FIGS. 7B and 7C are the other exemplary aspects of the electrostatic discharge protection element of the present disclosure. As shown in the figures, the electrostatic discharge protection element ESD7B includes a plurality of sharp-headed protrusions SHP. In the event of electrostatic discharge, the electrostatic discharge current is prone to flow to the sharp-headed protrusions SHP due to the point discharge effect, causing a high transient voltage generated thereon. Meanwhile, the gap structure GAP provides a plurality of conducting paths to direct the electrostatic discharge current to the ground terminal GND without affecting the electronic components electrically connected to the I/O pad I/OPAD. The electrostatic discharge protection element ESD7C provides a plurality of conducting paths through the polygonal I/O pad and the plurality of gap structures GAP1 and GAP2, such that the electrostatic discharge current flows to the plurality of ground terminals GND in the event of electrostatic discharge, so as to achieve the effect of electrostatic discharge protection. Here, the electrostatic discharge protection elements ESD7B and ESD7C are applicable to the aforementioned embodiments, and the user can modify the layout of the internal circuit according to the actual requirement.

In conclusion, when occurrence of an event of electrostatic discharge is considered, a gap structure of an electrostatic discharge protection element of the present disclosure is capable of providing a plurality of conducting path to direct the electrostatic current to the ground terminal, protecting the electronic component connected to the I/O pad. In addition, the I/O pad is feasible to be the layout cell for the chip integration. When the transient energy activates the path from the internal circuit to the ground terminal to conduct electrostatic discharge current, the orientation of the I/O pad layout cell is adjustable along with the gap structure to provide a conducting path for energy dissipation for the test such as ESD Test, system-level ESD test (E-gun test), EFT test, and surge test. Moreover, the I/O pad of the electrostatic discharge protection element of the present disclosure is applicable to the whole chip in the form of unit cell for fast integrating into system chip.

What is claimed is:

1. An electrostatic discharge (ESD) protection element of a semiconductor device, the ESD protection element leading out an electrostatic discharge current between an internal circuit and an input/output terminal in the event of electrostatic discharge, comprising:
an input/output (I/O) pad connected between the I/O terminal and the internal circuit;
a first conductor connected to the I/O pad;
a second conductor connected to a ground terminal; and
a gap structure disposed between the first conductor and the second conductor and configured to establish a path from the I/O pad to the first conductor, the second conductor and to the ground terminal for conducting the electrostatic discharge current;
wherein the first conductor, the second conductor and the gap structure are disposed in a same layer of the semiconductor device with a substantially same thickness.

2. The electrostatic discharge protection element of claim 1, wherein the gap structure comprises at least one air layer, at least one dielectric layer or at least one porous material.

3. The electrostatic discharge protection element of claim 1, wherein a shape of the I/O pad comprises a circle, a rectangle, and a polygon.

4. The electrostatic discharge protection element of claim 1, wherein the gap structure surrounds the I/O pad.

5. The electrostatic discharge protection element of claim 1, wherein the first conductor is further disposed between the I/O pad and the gap structure and configured to establish the path joining the I/O pad, the first conductor, the gap structure, and the second conductor connected to the ground terminal for conducting the electrostatic discharge current.

6. An electrostatic discharge (ESD) protection element of a semiconductor device, the ESD protection element leading out an electrostatic discharge current between a first internal circuit and a second internal circuit in the event of electrostatic discharge, comprising:
an I/O pad connected between the first internal circuit and the second internal circuit;
a first conductor connected to the I/O pad;
a plurality of second conductors connected to a plurality of ground terminals respectively; and
a plurality of gap structures respectively disposed between the first conductor and the plurality of second conductors and configured such that a plurality of paths from the I/O pad to the first conductor, to each of the plurality of second conductors connected to each ground terminal are formed for conducting the electrostatic discharge current;
wherein the first conductor, the plurality of second conductors and the gap structures are disposed in a same layer of the semiconductor device with a substantially same thickness.

7. The electrostatic discharge protection element of claim 6, wherein the plurality of gap structures comprise at least one air layer, at least one dielectric layer or at least one porous material.

8. The electrostatic discharge protection element of claim 6, wherein the plurality of gap structures surround the I/O pad.

9. The electrostatic discharge protection element of claim 6, wherein the plurality of second conductors are interconnected.

10. The electrostatic discharge protection element of claim 6, wherein the plurality of second conductors are further disposed between the I/O pad and each gap structure and configured such that a plurality of paths joining the I/O pad, each second conductor, each gap structure and each first conductor connected to each ground terminal conduct the electrostatic discharge current.

* * * * *